United States Patent
Delaunay

(10) Patent No.: US 11,043,603 B1
(45) Date of Patent: Jun. 22, 2021

(54) PASSIVATION OF INFRARED DETECTORS USING OXIDE LAYER

(71) Applicant: HRL LABORATORIES LLC, Malibu, CA (US)

(72) Inventor: Pierre-Yves Delaunay, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/212,789

(22) Filed: Mar. 14, 2014

Related U.S. Application Data

(60) Provisional application No. 61/793,353, filed on Mar. 15, 2013.

(51) Int. Cl.
| | |
|---|---|
| *H01L 31/0216* | (2014.01) |
| *H01L 31/18* | (2006.01) |
| *H01L 31/0224* | (2006.01) |

(52) U.S. Cl.
CPC ...... *H01L 31/0216* (2013.01); *H01L 31/0224* (2013.01); *H01L 31/18* (2013.01)

(58) Field of Classification Search
CPC ......... H01L 31/03046; H01L 27/14649; H01L 27/1465; H01L 31/101
See application file for complete search history.

(56) References Cited

U.S. PATENT DOCUMENTS

| | | | |
|---|---|---|---|
| 5,149,956 A * | 9/1992 | Norton | H01L 27/14621 250/226 |
| 5,296,384 A * | 3/1994 | Cockrum | H01L 21/443 257/E21.478 |
| 6,287,884 B1 * | 9/2001 | Jie | H01L 31/184 438/39 |
| 8,450,773 B1 * | 5/2013 | Kim | H01L 31/1844 250/338.4 |
| 8,835,979 B1 | 9/2014 | De Lyon et al. | |
| 2007/0215900 A1 * | 9/2007 | Maimon | B82Y 20/00 257/184 |
| 2010/0176420 A1 * | 7/2010 | Yao | H01L 31/11 257/187 |
| 2011/0001165 A1 * | 1/2011 | Smith | H01L 31/02024 257/184 |
| 2012/0273838 A1 * | 11/2012 | Kinch et al. | 257/188 |

(Continued)

OTHER PUBLICATIONS

Meyer, E.; Banerjee, K.; Ghosh, S.. Optimization of Surface Passivation for InAs—GaSb Infrared Photodetector. The Journal of Undergraduate Research at the University of Illinois at Chicago, [S.I.], v. 2, n. 1, Oct. 2008. ISSN 25726161. (Year: 2008).*

(Continued)

*Primary Examiner* — John A Bodnar
(74) *Attorney, Agent, or Firm* — Lewis Roca Rothgerber Christie, LLP

(57) ABSTRACT

An infrared detector and a method for manufacturing it are disclosed. The infrared detector contains an absorber layer responsive to infrared light, a barrier layer disposed on the absorber layer, a plurality of contact structures disposed on the barrier layer; and an oxide layer disposed above the barrier layer and between the plurality of the contact structures, wherein the oxide layer reduces the dark current in the infrared detector. The method disclosed teaches how to manufacture the infrared detector.

9 Claims, 5 Drawing Sheets

(56) References Cited

U.S. PATENT DOCUMENTS

2013/0020666 A1* 1/2013 Smith .......................... 257/432
2014/0264704 A1* 9/2014 D'souza ............ H01L 27/14687
　　　　　　　　　　　　　　　　　　　　　　　　257/436

OTHER PUBLICATIONS

Maimon, S., et al., "nBn detector, an infrared detection with reduced dark current and higher operating temperature," Applied Physics Letters, 89, Oct. 10, 2006, https://doi.org/10.1063/1.2360235, 4 pages.

Meyer, E., et al., "Optimization of Surface Passivation for InAs—GaSb Infrared Photodetector," Journal of Undergraduate Research 2, 1 (2008), 3 pages.

* cited by examiner

PASSIVATION OF INFRARED DETECTORS USING OXIDE LAYER

CROSS REFERENCE TO RELATED APPLICATIONS

This application claims the benefit of U.S. Provisional Application No. 61/793,353, filed on Mar. 15, 2013, which is incorporated herein by reference in its entirety.

STATEMENT REGARDING FEDERALLY SPONSORED RESEARCH OR DEVELOPMENT

The present invention was made with support from the United States Government under Grant number NRO000-11-C-0145 awarded by the United States Government. The United States Government has certain rights in the invention.

FIELD

The present invention relates to infrared detectors. More particularly, the present invention relates to a passivation of infrared detectors using oxide layer.

BACKGROUND

The performance of infrared Focal Plane Arrays (FPAs) is determined by the signal to noise ratio of the photon detectors. Two parameters that may control the sensitivity are the noise of the detectors without illumination (dark noise) and the dynamic range of the Read Out Integrated Circuit (ROIC)/sensor hybrid. Both parameters are determined by the dark current of the devices, that is to say the current generated by the sensors without illumination.

n-C-B-n devices are described in detail in U.S. application Ser. No. 13/152,896 "Compound-Barrier Infrared Photodetector", filed on Jun. 3, 2011, which is incorporated herein by reference in its entirety. During the manufacturing of n-C-B-n device 100, the material has to be etched in order to electrically insulate the different pixels of the array as shown in FIG. 1. This exposes the barrier layer 130 and can lead to high surface currents that can increase the overall dark current by several orders of magnitude. To improve the performance, the n-CB-n InAsSb devices known in the art are cleaned with a 10 s Buffered Oxide Etch (BOE) followed by a 20 s water rinse prior to passivation to remove any oxidation formed on the Al-based barrier 130. FIG. 1 depicts n-C-B-n device 100 without the oxide layer. As shown in FIG. 1, the device 100 comprises n-type contacts 110, 120 disposed above Al barrier layer 130 which is in turn disposed above an n-type absorber layer 140. The device 100 further comprises passivation layer 150 above the contacts 110, 120 and the barrier layer 130.

Similar devices have been fabricated using an n-B-n design based on an InAs absorber as described in an article by S. Maimon and G. W. Wicks, App. Phys. Lett 89, 151109 (2006), which is incorporated herein by reference in its entirety. In this case, the authors considered that the barrier layer acted as a passivation layer. While this may be true, the barrier is not protected from further processing steps that include hybridization and underfill of FPAs.

Embodiments disclosed in the present disclosure overcome the limitations of the prior art.

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

As known in the art, n-CB-n InAsSb devices are cleaned with a 10 s Buffered Oxide Etch (BOE) followed by a 20 s water rinse prior to passivation to remove any oxidation formed on the Al-based barrier. One skilled in the art considers the native oxide layer as an inappropriate layer to terminate the atomic bonds of the barrier before $SiO_2$ encapsulation and believes that oxidation build-up on the barrier layer is detrimental to the electric performance of the n-CB-n devices. Contrary to the prior art, presently disclosed embodiments demonstrate that oxidation does not increase the dark current and oxidation may act as a good initial passivation layer before encapsulation with other dielectric layers such as $SiO_2$.

As described below, in some embodiments, using native or artificially grown oxide layers to prepare the surface of the devices for passivation terminates the atomic bonds of the barrier layer, acting itself as passivation layer prior to encapsulation. This reduces the dark current of the detectors by about three orders of magnitude compared to the previous surface treatment. By reducing the dark current, presently disclosed processes enable imaging at much lower photon fluxes (photon starved conditions). Also, by reducing the dark current, it is possible to operate the detectors at higher temperatures. This decreases the weight, volume and power consumption of infrared camera systems.

Figure 2:
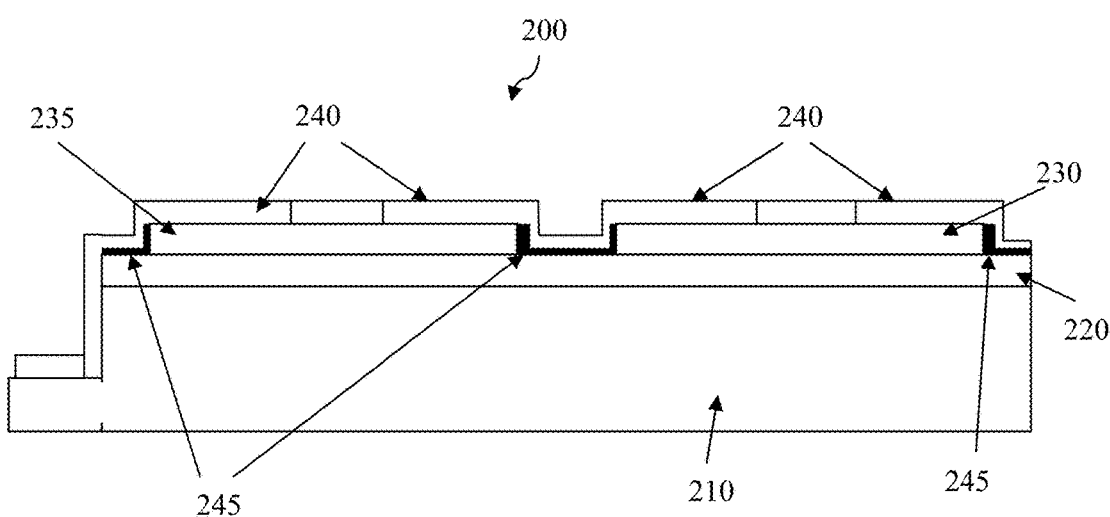
FIG. 2 depicts an embodiment according to the present disclosure.

Referring to FIG. 2, in one embodiment presently disclosed, an infrared detector 200 comprises an absorber layer 210 supporting a barrier layer 220. In some embodiments, the absorber layer 210 comprises an n-type material. In some embodiments, the absorber layer 210 comprises $InAs_xSb_{1-x}$ material. In some embodiments, the barrier layer 220 comprises AlGaAsSb or AlAsSb material. The infrared detector 200 further comprises one or more contact structures 230, 235 disposed above the barrier layer 220. The infrared detector 200 also comprises a passivation layer 240 above the one or more contact structures 230, 235 and the barrier layer 220. The infrared detector 200 further comprises an oxide layer 245 disposed between the passivation layer 240 and the barrier layer 220.

Figure 3A:
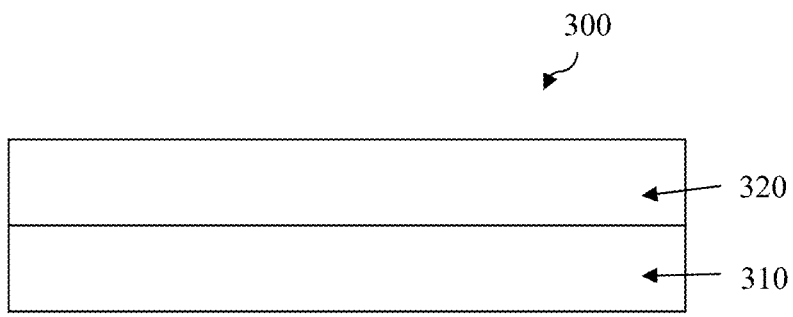
FIGS. 3a-f depict another embodiment according to the present disclosure.
Figure 3B:
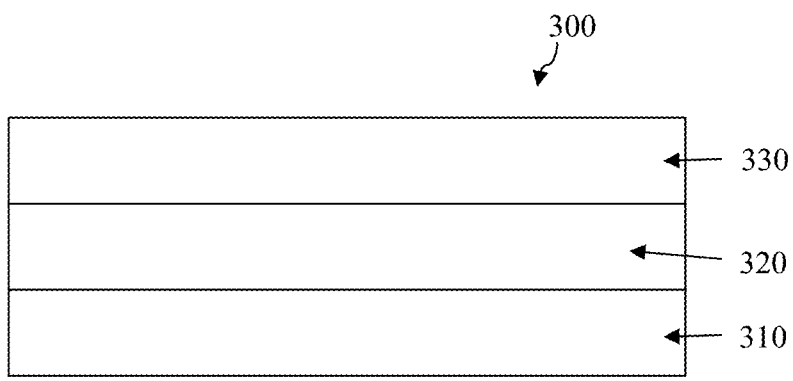
Figure 3C:
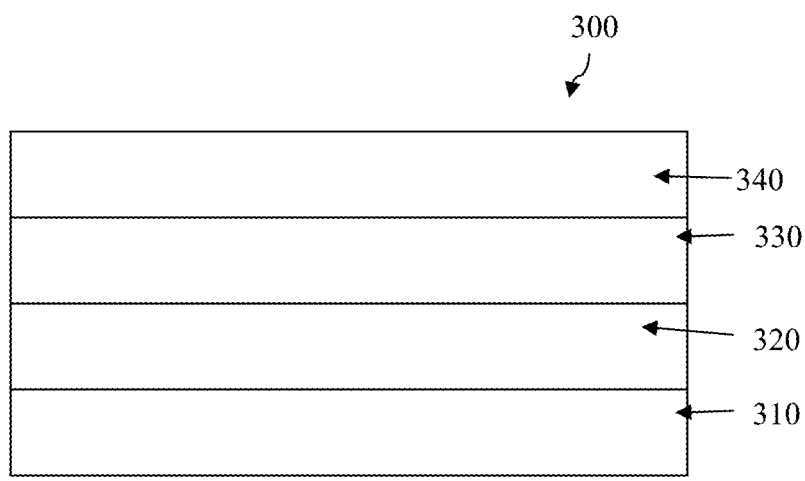
Figure 3D:
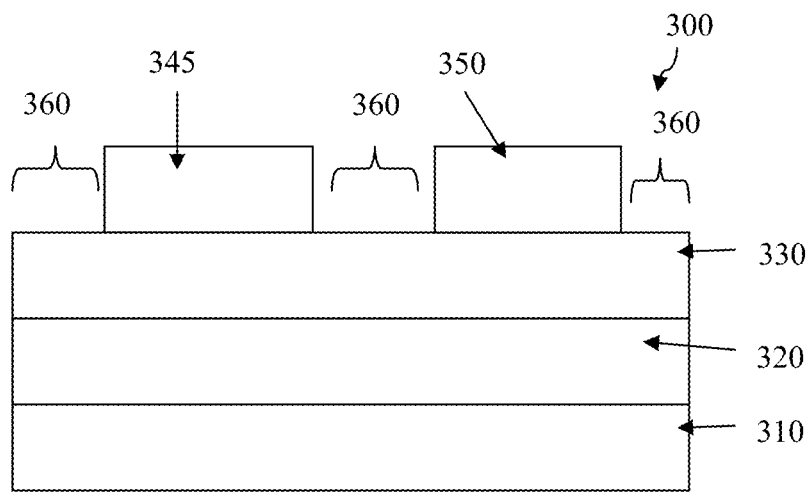
Figure 3E:
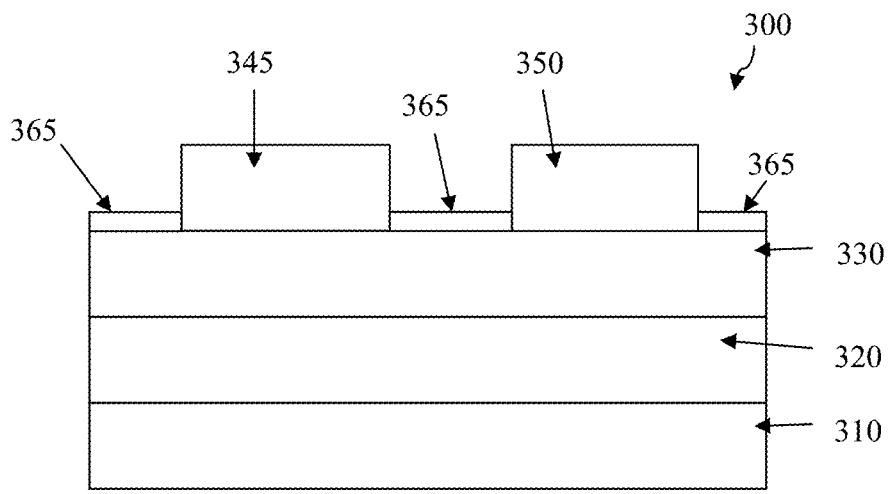

In some embodiments, an infrared detector 300 is formed by forming an absorber layer 320 above a substrate 310 as shown in FIG. 3a; forming a barrier layer 330 above the absorber layer 320 as shown in FIG. 3b; forming a contact layer 340 above the barrier layer 330 as shown in FIG. 3c; dry etching the contact layer 340 to form the one or more contact structures 345, 350 and exposing one or more portions 360 of the barrier layer 330 that were previously covered by the contact layer 340 as shown in FIG. 3d; forming an oxidation layer 365 to cover the one or more portions 360 of the barrier layer 330 as shown in FIG. 3e. In some embodiments, the oxidation layer 365 is formed using, for example, an $O_2$ plasma process, a thermal oxidation process, and/or natural oxidation process where the infrared detector 300 is allowed to sit at a room temperature for a pre-determined period of time. In one embodiment, the oxidation process creates a passivation layer composed of Al-oxides, As-oxides and Sb-oxides when the barrier layer 330 comprises AlAsSb material. These oxides act as a passivation layer that perfectly terminates the dangling atomic bonds generated by the dry etching process used to form the one or more contact structures 345, 350. In one embodiment, the oxidation layer 365 is formed on the sides of the one or more contact structures 345, 350.

Figure 3F:
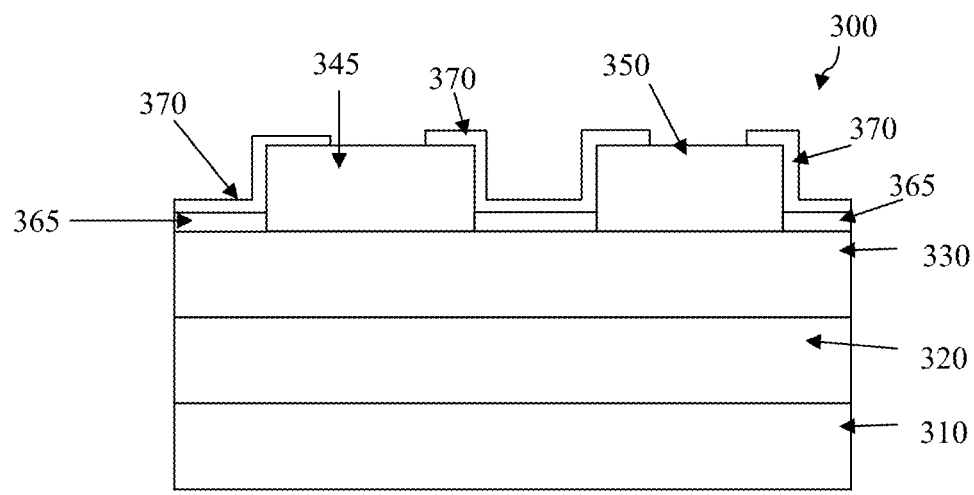

In some embodiments, at least a portion of the one or more contact structures 345, 350 and the oxide layer 365 are encapsulated in $SiO_2$ layer 370 (shown in FIG. 3f) deposited by, for example, Plasma-enhanced Chemical Vapor Deposition (PECVD) process. The $SiO_2$ layer 370 prevents the oxidation layer 365 from being removed or altered by further processing of the infrared detector 300.

In some embodiments, the above described semiconductor layers are formed by a molecular beam epitaxy (MBE) process or any other process known in the art.

Infrared detector samples A-E were prepared and tested to demonstrate effectiveness of the presently described embodiments. The samples were dry etched down to the barrier layer and different surface preparations and passivations were applied for different samples as described below.

Figure 1:
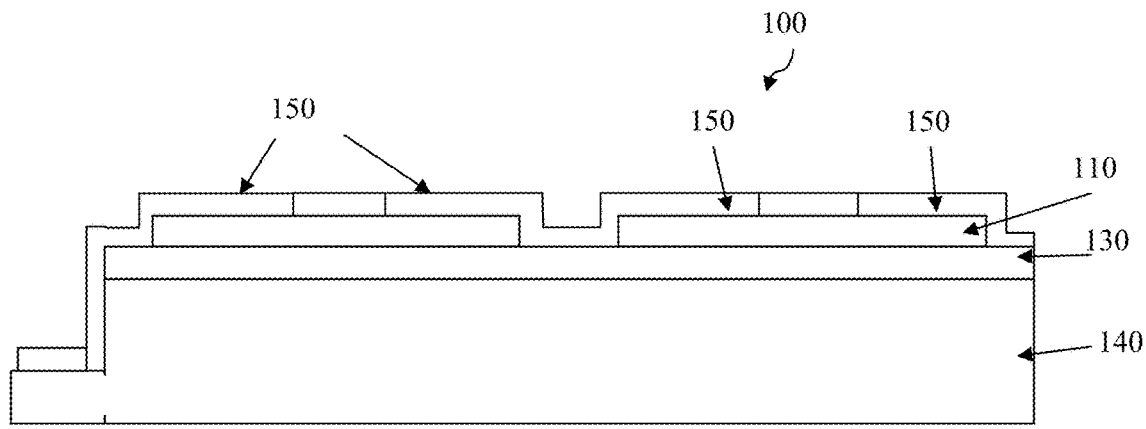
FIG. 1 depicts a device known in the art.

Sample A: After etching down to the barrier layer, the sample was etched for 10 s in BOE and rinsed for 20 s in water. It was then passivated using PECVD $SiO_2$. This is a reference sample, corresponding to an infrared detector known in the art and shown in FIG. 1.

Sample B: After etching down to the barrier layer, the sample was directly passivated using $SiO_2$ deposited with an e-beam evaporator.

Sample C: After etching down to the barrier layer, the sample was oxidized for 2 min in an O2 plasma generated with a power of 100 W. It was then passivated using PECVD $SiO_2$.

Sample D: After etching down to the barrier layer, the sample was oxidized for 10 min in air on a hot plate at 100 C. It was then passivated using PECVD $SiO_2$.

Sample E: After etching down to the barrier layer, the sample was oxidized for 2 min in an O2 plasma generated with a power of 100 W. It was then passivated using $SiO_2$ deposited with an e-beam evaporator.

Finally, windows were opened into the passivation layer and ohmic contacts were formed. The dark current and turn-on voltage were measured at 120 K to determine any improvement in performance and the results are shown in Table 1.

TABLE 1

| Sample | Surface Treatment | Passivation | Turn-on V | Dark current density A/cm2 |
|---|---|---|---|---|
| A | BOE etch | $SiO_2$ PECVD | 0.2 | 1.40E−06 |
| B | None | $SiO_2$ e-beam | 0.4 | 1.00E−08 |
| C | 2 min O2 plasma | $SiO_2$ PECVD | 0.6 | 1.00E−09 |
| D | 10 min on hot plate | $SiO_2$ PECVD | 0.3 | 1.00E−09 |
| E | 2 min O2 plasma | $SiO_2$ e-beam | 0.5 | 2.00E−09 |

Comparing sample A and B, it is clear that the BOE etch increases the dark current of the devices. This is because the BOE solution removes the thermal oxide that naturally grows on top of the barrier layer between the dry etching and passivation steps. The absence of oxide increases the surface leakage of the devices.

Sample C, D and E were intentionally oxidized just after etching. This improved the dark current by at least one order of magnitude. The techniques used to grow the oxide did not impact the performance of the devices at operating bias. Similar dark current performances were achieved at operating bias.

Figure 4:
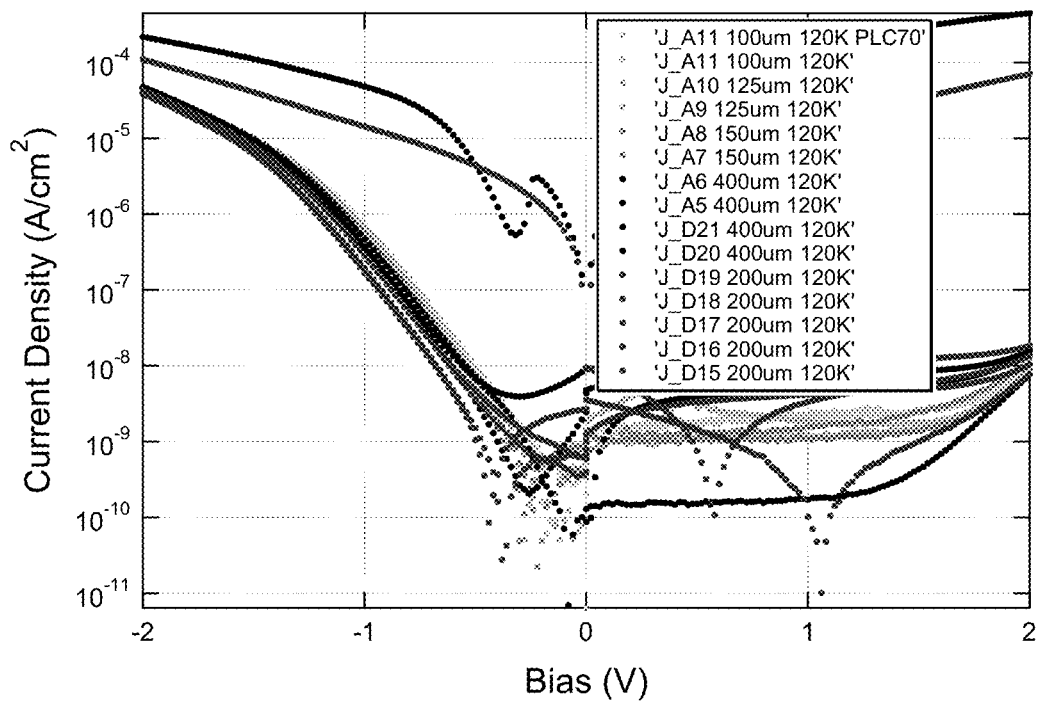
FIG. 4 depicts measurements for an embodiment according to the present disclosure.

However, the techniques used to grow the oxide did impact the performance of the devices at the turn-on voltage. As shown in Table 1, turn-on voltage of Sample D is lower compared to Samples C and E. This is advantageous for FPA fabrication because the ROIC applies up to about 500 mV of bias. Therefore, the oxidation process used for sample D may be used for the fabrication of very low dark current FPAs based on n-CB-n devices. FIG. 4 depicts current/voltage measurements of Sample D at 120 K.

Figure 5:
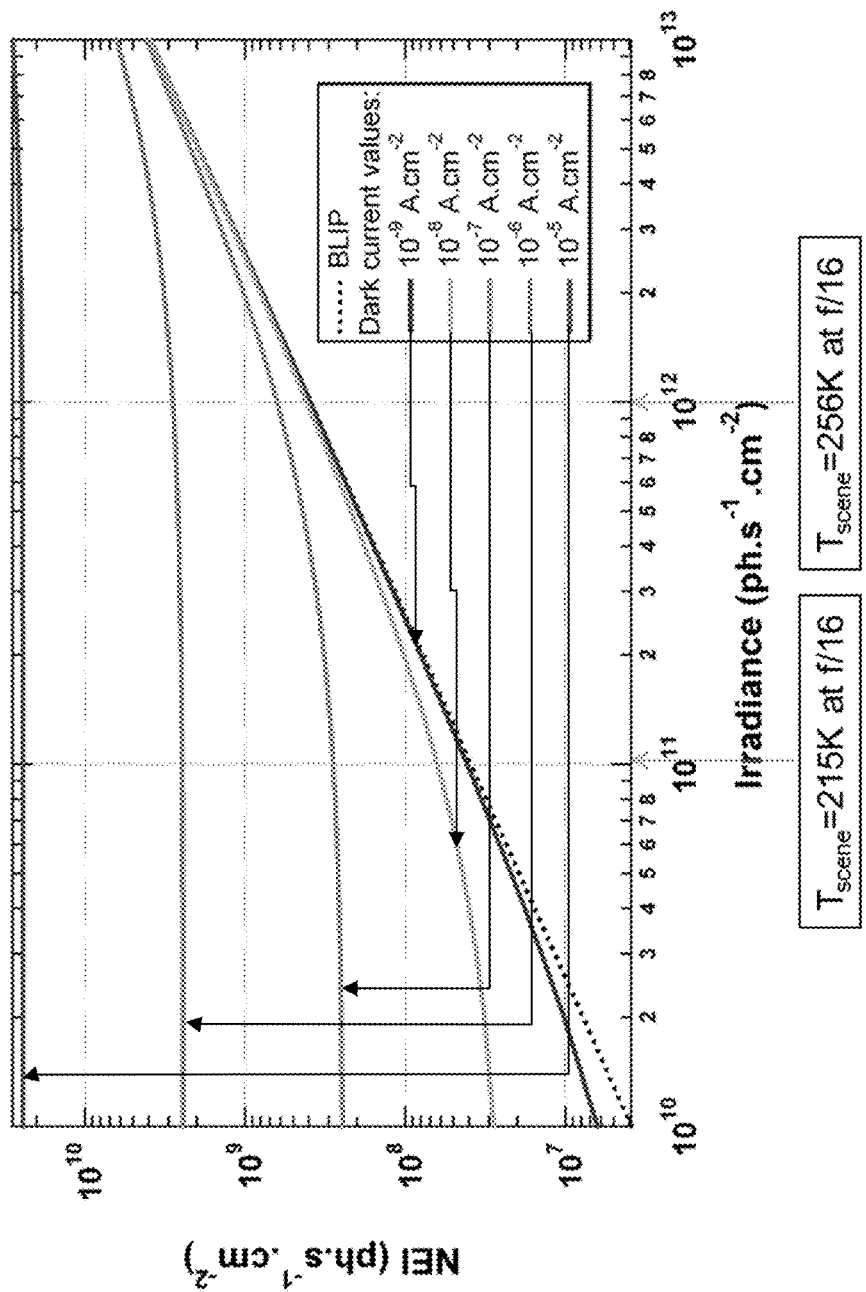
FIG. 5 depicts variation of the Noise equivalent Input (NEI) of an FPA for different irradiances and dark current densities.

As shown, the oxidation of the barrier layer improved the dark current of n-CB-n devices by 3 orders of magnitude at operating bias. Such a reduction in dark current increases the sensitivity of FPAs at very low irradiance. FIG. 5 describes the variation of the Noise equivalent Input (NEI) of an FPA for different irradiances and dark current densities. The NEI is a standard measure of the sensitivity of the infrared camera. The dot line corresponds to the Background Limited Performance (BLIP), which is the lowest theoretical NEI that can be achieved. According to the simulation, a detector with a dark current density of $10^{-6}$ $A \cdot cm^{-2}$ achieves BLIP for background fluxes superior to $10^{13}$ $ph \cdot s^{-1} \cdot cm^{-2}$. In comparison, a detector with a dark current density of $10^{-9}$ $A \cdot cm^{-2}$ achieves BLIP for background fluxes superior to $10^{10}$ $ph \cdot s^{-1} \cdot cm^{-2}$. Due to reduction in dark current achieved with this process, FPAs are be able to perform imaging at much lower photon fluxes.

More details about n-C-B-n devices that are not disclosed above can be found in U.S. application Ser. No. 13/152,896 "Compound-Barrier Infrared Photodetector", filed on Jun. 3, 2011, which is incorporated herein by reference in its entirety.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "step(s) for . . . ".

What is claimed is:

1. An infrared detector comprising:
   an absorber layer responsive to infrared light;
   a barrier layer disposed on the absorber layer;
   a plurality of contact structures disposed on the barrier layer;
   a passivation layer above the barrier layer; and
   an oxide layer disposed between the barrier layer and the passivation layer, and between the plurality of the contact structures, wherein the oxide layer reduces the dark current in the infrared detector;
   wherein at least one of the contact structure of the plurality of contact structures comprises a first side and a second side extending between the barrier layer and the passivation layer;
   wherein the oxide layer completely covers at least the first side.

2. The infrared detector of claim 1, wherein the passivation layer at least partially covers at least one contact structure out of the plurality of contact structures.

3. The infrared detector of claim 1, wherein the oxide layer at least partially covers at least one contact structure out of the plurality of contact structures.

4. The infrared detector of claim 1, wherein the oxide layer is formed from a material having at least one element in common with material forming the barrier layer.

5. The infrared detector of claim 1, wherein the oxide layer comprises an Al-oxide and the barrier layer comprises AlAsSb material.

6. The infrared detector of claim 1, wherein the oxide layer comprises an As-oxide and the barrier layer comprises AlAsSb material.

7. The infrared detector of claim 1, wherein the oxide layer comprises an Sb-oxide and the barrier layer comprises AlAsSb material.

8. An infrared detector comprising:
   an absorber layer responsive to infrared light;
   a barrier layer disposed on the absorber layer;
   a plurality of contact structures disposed on and in direct contact with the barrier layer;
   a passivation layer above the barrier layer, wherein the passivation layer comprises first material; and
   an oxide layer disposed between the barrier layer and the passivation layer, and between the plurality of the contact structures, wherein the oxide layer reduces the dark current in the infrared detector;
   wherein the oxide layer comprises a second material.

9. An infrared detector comprising:
   an absorber layer responsive to infrared light;
   a barrier layer disposed on the absorber layer;
   a plurality of contact structures disposed on the barrier layer;
   a passivation layer above the barrier layer, wherein the passivation layer comprises a first material; and
   an oxide layer disposed between the barrier layer and the passivation layer, and between the plurality of the contact structures, wherein the oxide layer reduces the dark current in the infrared detector, wherein the oxide layer comprises a second material, wherein the oxide layer completely covers at least one side of one of the contact structures in the plurality of contact structures.

* * * * *